United States Patent
Wen

[19]

[11] Patent Number: 6,144,264
[45] Date of Patent: Nov. 7, 2000

[54] HIGH Q-FACTOR OSCILLATOR CIRCUIT

[75] Inventor: Cheng P. Wen, Mission Viejo, Calif.

[73] Assignee: Raytheon Company, Lexington, Mass.

[21] Appl. No.: 09/378,791

[22] Filed: Aug. 23, 1999

[51] Int. Cl.$^7$ ................................. H03B 7/14; H03B 9/14
[52] U.S. Cl. ........................ 331/96; 331/107 DP; 333/230
[58] Field of Search .................................. 331/96, 117 D, 331/107 DP, 107 G, 107 T; 333/230

[56] References Cited

U.S. PATENT DOCUMENTS

| | | | |
|---|---|---|---|
| 3,831,110 | 8/1974 | Eastman | 331/107 G |
| 3,913,035 | 10/1975 | Havens | 331/107 R |
| 4,286,229 | 8/1981 | Hislop | 331/107 DP |

*Primary Examiner*—Siegfried H. Grimm
*Attorney, Agent, or Firm*—Leonard A. Alkov; Glenn H. Lenzen, Jr.

[57] ABSTRACT

A millimeter-wave/microwave oscillator circuit and method of fabricating same are disclosed. A high Q-factor resonator is formed by disposing a transferred electron negative resistance device, such as a Gunn diode, or an IMPATT negative resistance device in a semi-circular cross-sectional shaped resonator cavity. The equivalent capacitance of the negative resistance diode can be designed to resonate with the equivalent series inductance for the resonator cavity by adjusting the dimensions of the cavity and the placement of the negative resistance device therein. Very low cost, compact and lightweight microwave and millimeter-wave integrated circuit power sources using negative resistance diodes can be batch manufactured.

12 Claims, 5 Drawing Sheets

HIGH Q-FACTOR OSCILLATOR CIRCUIT

BACKGROUND OF THE INVENTION

The present invention is directed to millimeter-wave and microwave circuit oscillators.

Millimeter-wave/microwave transceiver technology is useful in numerous applications, including vehicle obstacle avoidance and smart munitions applications. Transceiver radars operating within this wavelength range can penetrate fog and smoke, and provide good detection target resolution. Vehicle obstacle avoidance and smart munitions applications require highly efficient transceivers that are low in cost. To achieve high-efficiency, high Q-factor oscillator sources must be used which must be low in cost and provide good frequency stability and low noise output.

Traditionally, two types of oscillator sources have been used in millimeter-wave/microwave transceivers, referred to as integrated oscillators and waveguide cavity-based oscillators. Some integrated oscillators, such as transistor-based integrated oscillators, use costly components and are, therefore, too expensive. Other integrated oscillators, such as microstrip or coplanar integrated oscillators, use dielectric material and highly resistive elements and therefore do not exhibit high Q-factor operation. Waveguide cavity-based oscillators are also undesirable because they are often bulky, require highly labor-intensive post-assembly tuning and testing, and are not adaptable to low-cost batch fabrication methods, making them too expensive for use in most applications.

Therefore, there is a need for a high Q-factor oscillator that can be produced at an affordable cost and can be used in the millimeter-wave/microwave wavelength range.

SUMMARY OF THE INVENTION

According to an aspect of the present invention, a millimeter-wave/microwave oscillator circuit comprising a substrate, a transmission line, and a resonator cavity with an equivalent inductance is provided. A negative resistance diode is disposed within the cavity and has an equivalent capacitance and resistance substantially resonant with the equivalent inductance of the resonator cavity. For impedance matching between the transmission line and the cavity, an RF impedance transformer is also provided.

According to a further aspect of the present invention, a method of fabricating a millimeter-wave/microwave oscillator circuit is provided comprising the steps of etching a transmission line in a substrate and depositing conductive material thereon; etching a resonator cavity in the substrate and depositing conductive material thereon; disposing a negative resistance diode in the cavity and further electrically connecting the negative resistance diode to the transmission line.

According to yet another aspect of the present invention, a method of fabricating a millimeter-wave/microwave oscillator circuit is provided. The method comprises the steps of providing a lower substrate portion and forming a first portion of a transmission line and a first portion of a resonator cavity in the lower substrate portion. The method also comprises the steps of providing an upper substrate portion and forming a second portion of the transmission line, a second portion of the resonator cavity, and an RF impedance transformer segment in the upper substrate portion. The steps of disposing a negative resistance diode in the first portion of the resonator cavity, connecting the diode to the transmission line, and coupling the upper and lower substrate portions are also provided.

According to another aspect of the present invention, a negative resistance diode oscillator is provided. The oscillator comprises a transmission line, a resonator cavity with an equivalent inductance L, and an impedance matching segment matching the impedance between the transmission line and the resonator cavity. The resonator cavity has a semi-circular shape of radius R2 and height H. A negative resistance diode is coupled to the cavity at a distance R1 from the side of a cavity wall and has an equivalent capacitance and an equivalent resistance. The dimensions of the cavity and placement of the diode within the cavity are chosen such that the cavity inductance value L is substantially resonant with the equivalent capacitance and resistance of the negative resistance diode at a desired frequency and is approximated by $L \approx 60*(H/R1)*\tan(k*(R2-R1))$, where k is a wave number.

DESCRIPTION OF THE PREFERRED EMBODIMENT

Figure 1:
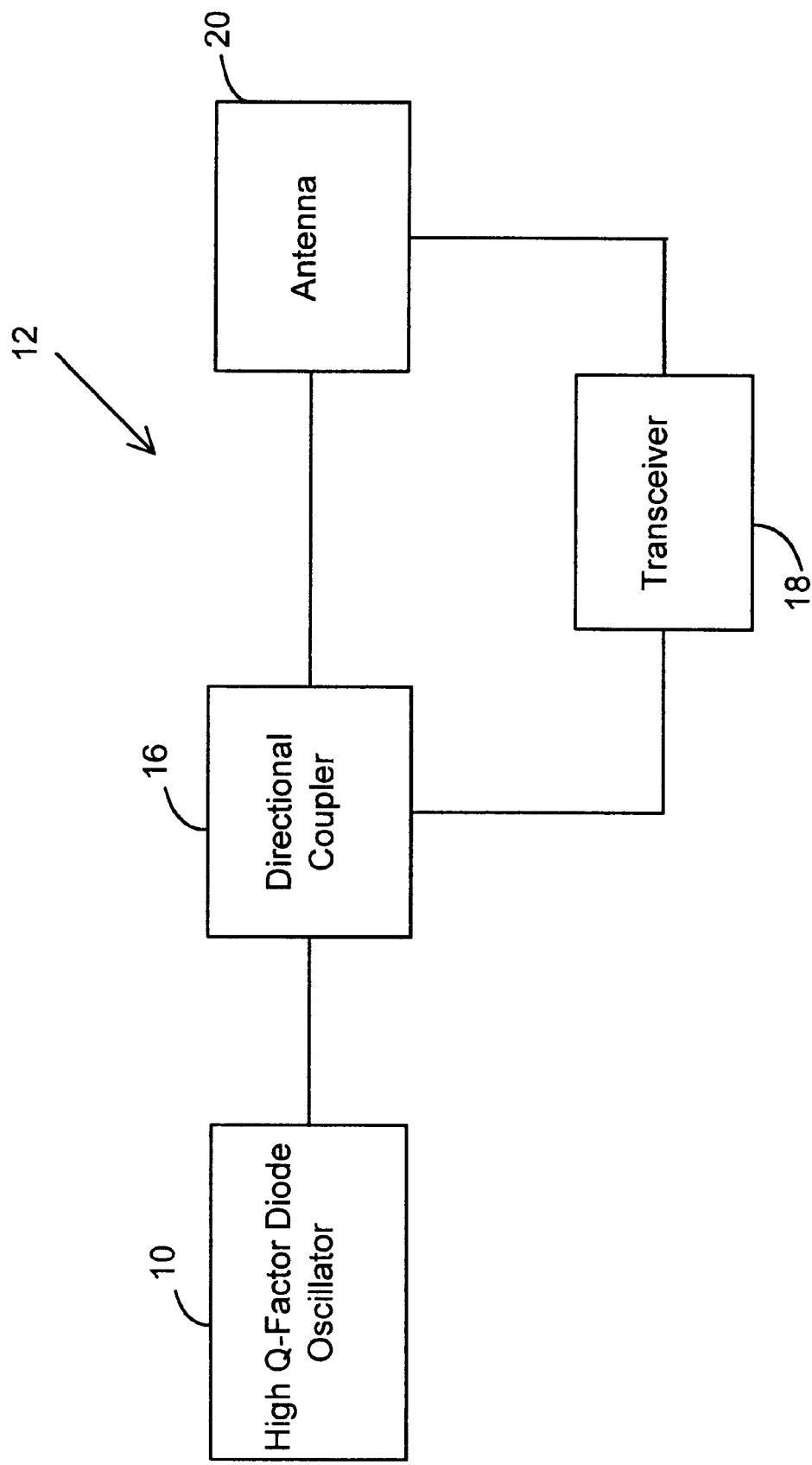
FIG. 1 is a block diagram showing a high Q-factor diode oscillator in a millimeter-wave/microwave transceiver circuit.

A high Q-factor millimeter-wave/microwave oscillator circuit 10 used in a millimeter-wave/microwave transceiver 12 is shown in FIG. 1. As will be appreciated by persons of ordinary skill in the art, the high Q-factor oscillator 10 can be employed in numerous environments and is not limited to the particular environment of FIG. 1. The high Q-factor oscillator 10 claimed in the present invention is understood to apply to other applications driving both millimeter-wave and microwave circuitry. The transceiver 12 shown in FIG. 1 is by way of example and forms no part of the present invention. Therefore, it will be disclosed only in general detail herein.

In operation within the particular environment of FIG. 1, the high Q-factor oscillator 10 receives a DC bias signal from a voltage source (not shown) for a transferred electron or IMPATT, negative resistance device comprising a negative resistance diode 14 which forms a part of the oscillator 10. The high Q-factor oscillator 10 generates an oscillator signal and provides this oscillator signal to a coupling circuit, such as a directional coupler 16. Typically, the oscillator signal is at a substantially fixed frequency of at least 30 GHz. The directional coupler 16 transmits a portion of the oscillator signal from the high Q-factor oscillator 10 to a transceiver circuit 18 for performing transmit and receive circuit functions. The directional coupler 16 transmits a second portion of the oscillator signal to an antenna 20, wherein the oscillator signal excites the antenna 20 and causes it to radiate RF energy.

Figure 2:
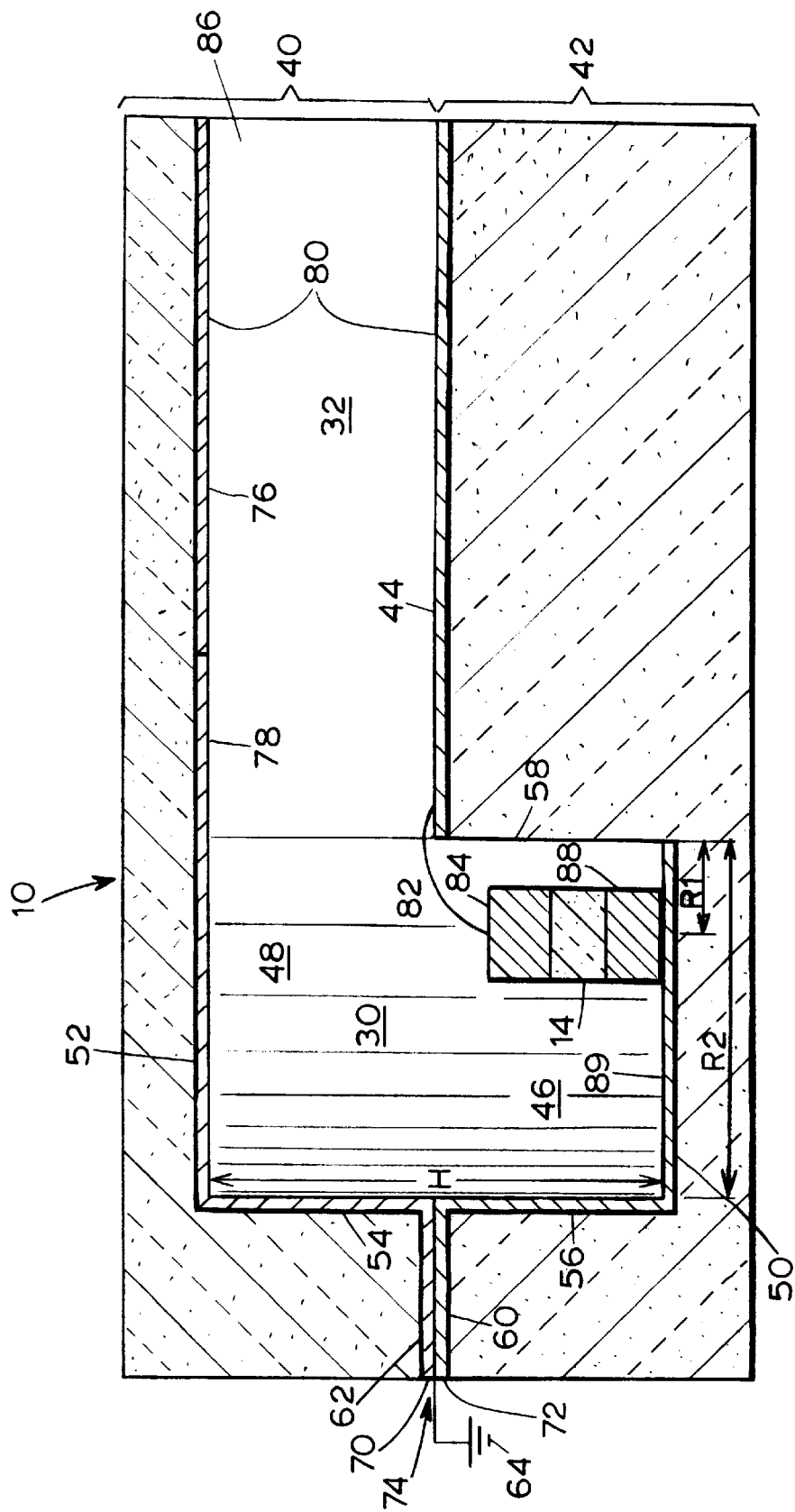
FIG. 2 is a fall sectional view of the high Q-factor oscillator circuit showing an embodiment of the present invention.
Figure 5:
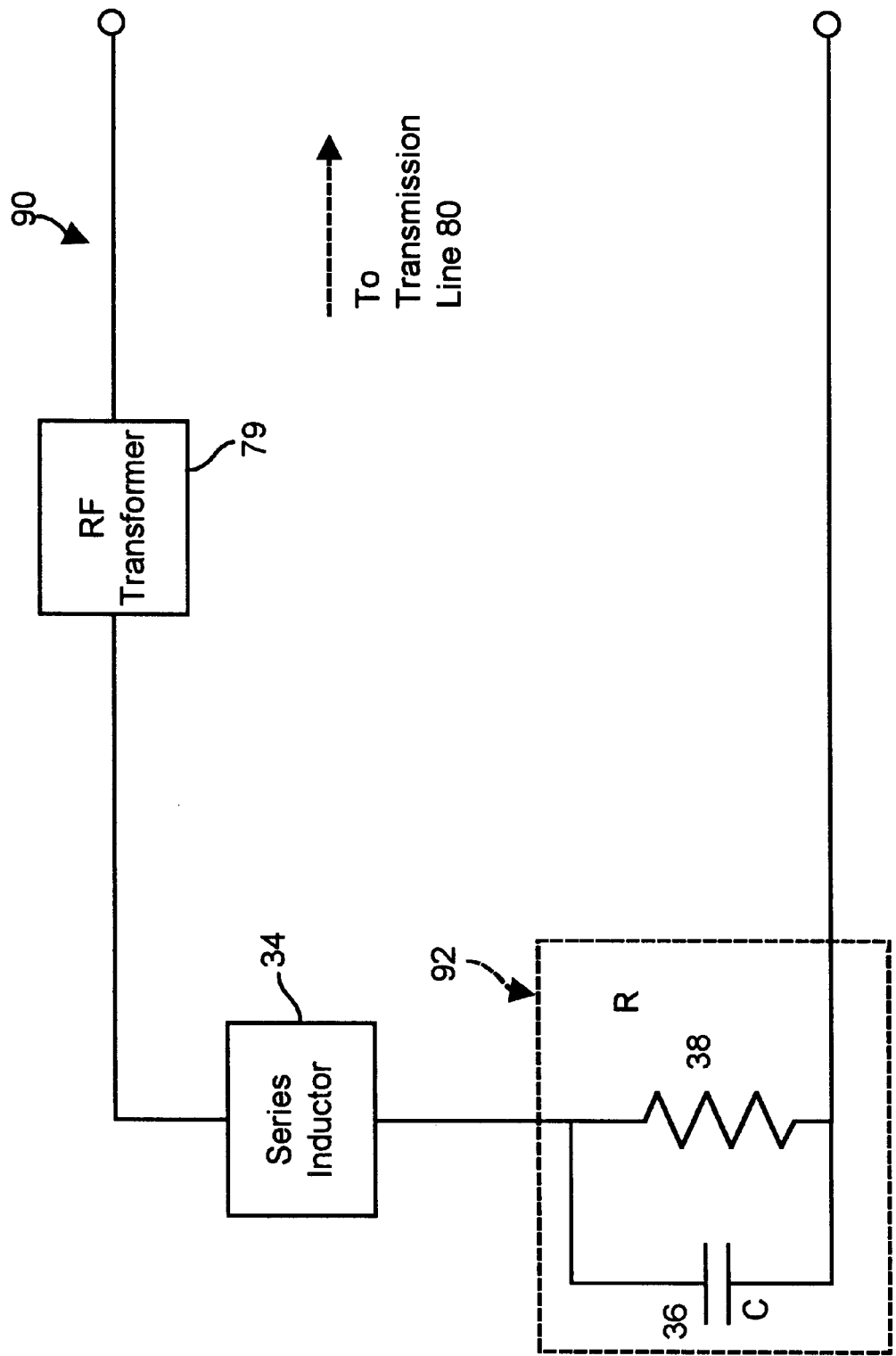
FIG. 5 is a circuit diagram of an equivalent resonant circuit of the high Q-factor oscillator.

FIG. 2 is a detailed sectional view of the high Q-factor oscillator circuit 10. The high Q-factor oscillator 10 is a waveguide cavity oscillator having a cavity 30, which acts as a resonator producing the oscillator signal at an oscillator signal frequency, and a waveguide 32, for sending the transmission signal from the cavity 30 to external circuits. The negative resistance diode 14, such as a Gunn diode or an IMPATT diode, is placed within the cavity 30. The diode 14 can be modeled by a capacitance 36 in parallel with a negative resistance 38, as depicted in FIG. 5. As discussed below, the position of the diode 14 within the cavity 30 determines the effective values of this capacitance 36 and negative resistance 38. The cavity 30 acts as a high Q-factor inductor 34 in series with the equivalent capacitance 36 and negative resistance 38 of the diode 14. As discussed in greater detail below, the shape and dimensions of the cavity 30 and the position of the diode 14 within the cavity 30 determine, at least in part, the value of the inductance L of series inductor 34. The dimensions of the cavity 30 and the position of the diode 14 within the cavity 30 are chosen to tune the oscillator circuit 10 to obtain a desired, substantially constant oscillator frequency. This tuning occurs at the fabrication level and thus eliminates the costly post assembly tuning traditionally associated with cavity-based millimeter-wave/microwave oscillators.

The preferred embodiment of the high Q-factor oscillator 10 shown in FIG. 2, according to the present invention, comprises an upper substrate portion 40 and lower substrate portion 42. The upper substrate portion 40 and the lower substrate portion 42 define the waveguide 32 and the cavity 30. Both the upper substrate portion 40 and the lower substrate portion 42 can be batch fabricated individually on separate substrate wafers producing hundreds of upper substrate portion 40 and lower substrate portion 42 fabricated pairs.

The lower substrate portion 42 includes a lower transmission line segment 44 which is used both to receive an external excitation signal for DC biasing the negative resistance diode 14 and to transmit the oscillator signal through the waveguide 32 to external circuitry, such as used in transceiver 12. The lower transmission line segment 44 is preferably rectangular (as seen in plan view) and initially etched into the substrate portion 42 using known photolithographic batch fabrication techniques, such as gas phase or chemical etching. The etched area outlining the lower transmission line segment 44 is then metallized to deposit a thin metal film over the etched area. This can occur utilizing any known process, such as sputtering, from which film depths on the order of a micron can be achieved. Similar techniques may be used for other etched elements of the present invention.

The resonant cavity 30 is formed by a lower portion 46, disposed in the lower substrate portion 42, and an upper portion 48, disposed in the upper substrate portion 40. In the preferred embodiment, both the lower portion 46 and upper portion 48 are fabricated by deep etching of the lower substrate portion 42 and upper substrate portion 40, respectively. As with the lower transmission line segment 44 of the lower substrate portion 42, the lower portion 46 and upper portion 48 of the cavity may be batch fabricated on substrate wafers.

The cavity 30 is preferably air-filled, although it may be filled with different material or gas. In a preferred embodiment, the cavity 30 has a semi-circular cylindrical shape. Alternatively, the cavity 30 may have a different shape, such as a rectangular shape in plan view, and may or may not be cylindrical. The shape and dimensions of the cavity 30 are chosen to determine, in part, the inductance L of series inductor 34 resonant with the effective capacitance 36 and negative resistance 38 of the diode 14.

To form the enclosed resonator cavity, a metallization process is utilized to deposit thin metal film layers on walls 50, 52, 54, and 56. No metallization is provided on a flat cavity wall 58 of the cavity 30 to avoid shorting the cavity 30 with the lower transmission line segment 44. The depth of the thin metal film layer should be uniform on the walls 50, 52, 54, and 56 to establish proper electrical operation.

Upper and lower metallized contacts 70, 72 are also formed on walls 62 and 60, respectively, and are connected together at a common node 74 and to DC ground 64. The node 74 is electrically connected to a first end of the diode 14 by the metallized cavity.

In addition to the upper metallized contact 70 and the upper portion of the cavity 48, the upper substrate portion 40 of the oscillator circuit 10 includes an upper transmission line segment 76 and an RF impedance transformer segment 78 (represented by a block 79 of FIG. 5). The upper transmission line segment 76 and the lower transmission line segment 44 form a two-line transmission line 80 and transmit the oscillator signal to electrically coupled circuits, such as shown in FIG. 1. The upper transmission line segment 76 is preferably of a narrower width than the lower transmission line segment 44, as can be seen in FIGS. 4 and 3.

The RF impedance transformer segment 78 is disposed in the upper substrate portion 40 between the upper transmission line segment 76 and the upper cavity portion 48. The RF impedance transformer segment 78 is preferably rectangular in plan view with a width greater than the upper transmission line segment 76 but less than the lower transmission line segment 44, as can be seen in FIGS. 4 and 3. The impedance transformer segment 78 matches the impedance of the diode 14, which is approximately 1 ohm, to that of the two-line transmission line 80, which is approximately 30 ohms. The impedance transformer segment 78 is formed by etching and metallization processes similar to those utilized to deposit the metal film layers on the walls 50, 52, 54, and 56 of cavity 30.

Figure 3:
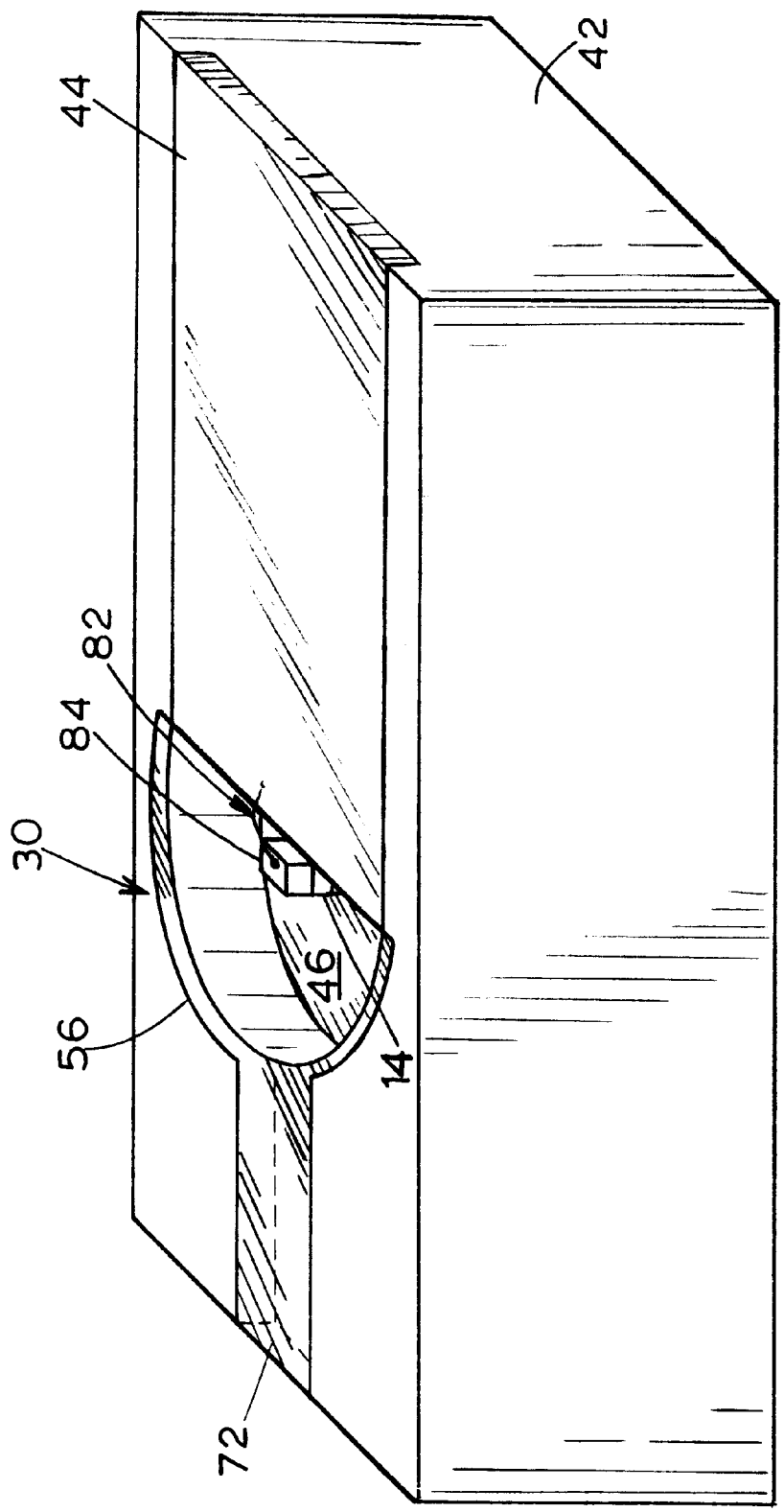
FIG. 3 is a trimetric view of a top surface and inner components of a lower substrate employed in an embodiment of the present invention.

Referring now to FIG. 3, the lower transmission line segment 44 for biasing the negative resistance diode 14 and for transmitting the oscillator signal is shown. The lower transmission line segment 44 is electrically coupled to the diode 14 via a lead 82, which is attached across the transmission line segment 44 and an upper diode contact layer 84, disposed on the diode 14. The upper diode contact layer 84 can be a thin metal film layer deposited through known processes. The lower cavity portion 46 and the lower metallized contact 72, which couples the lower substrate portion 42 and the upper substrate portion 40, are also shown.

Figure 4:
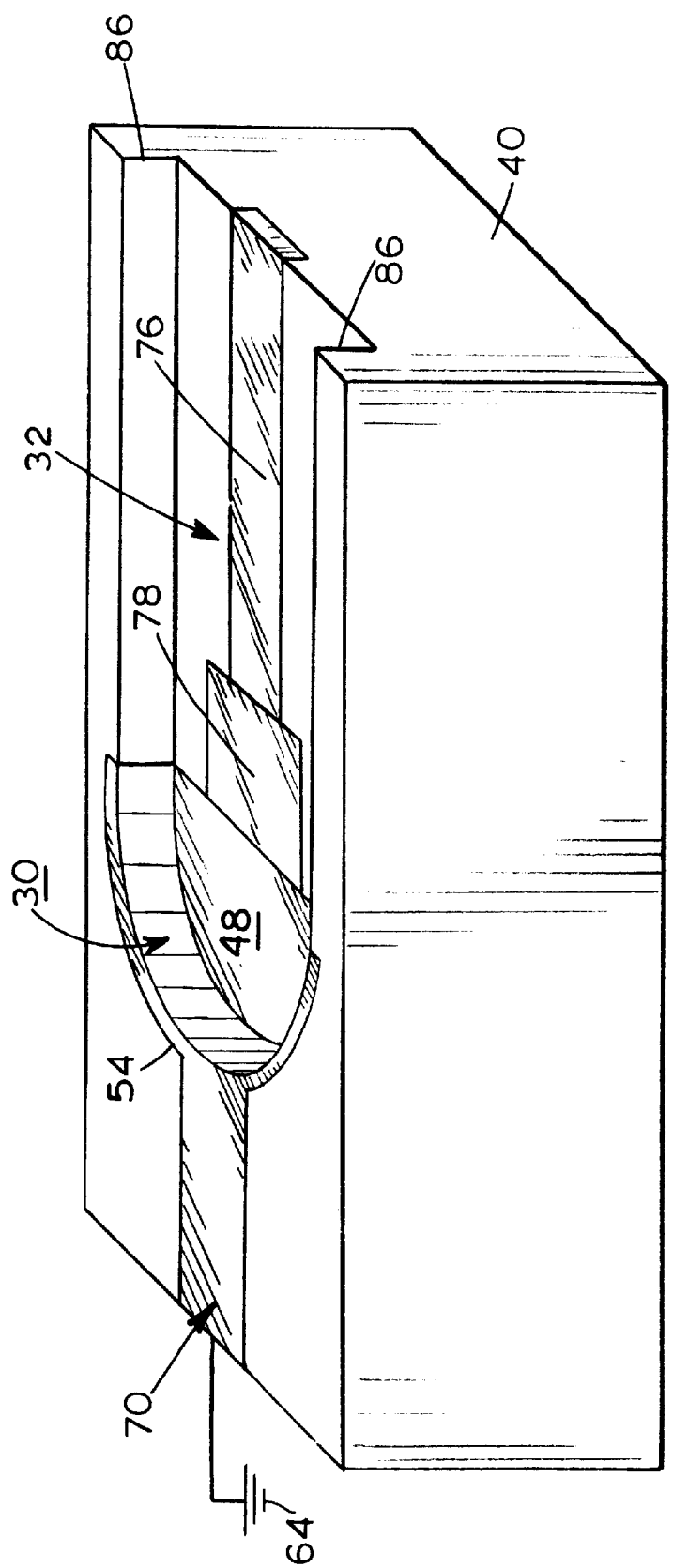
FIG. 4 is a trimetric view of a bottom surface and inner structure of an upper substrate employed in an embodiment of the present invention.

Referring now to FIG. 4, the upper substrate portion 40 is shown. In a preferred embodiment, the upper substrate portion 40 and the lower substrate portion 42 are coupled together to form the oscillator 10 as a single-piece device. The coupling can occur through traditional processes, including soldering the upper metallized contact 70 to the lower metallized contact 72, thereby forming the enclosed metallized oscillator cavity 30 and waveguide 32.

As can be seen in FIG. 4, the waveguide walls 86, created during the etching of the upper cavity portion 48 and the waveguide 32, are not metallized. Only the upper transmission line segment 76 and the lower transmission line segment 44 are electrically coupled to the cavity 30 and the diode 14 therein.

Referring again to FIG. 2, the upper diode contact 84 and a lower diode contact 88 are used to couple the negative resistance diode 14 to the cavity 30 and the lower transmission line segment 44. Both diode contacts 84, 88 are formed by using a metallization process creating a thin metal contact layer. The diode 14 is placed inside the cavity 30 and operably connected to the cavity 30 via the lower diode contact 88, while the other end of the diode 14 is operably connected to the lower transmission line segment 44 via the upper diode contact layer 84 and the wire lead 82.

The diode 14 may be fabricated in batch quantities by conventional processes on a single silicon wafer, which is separated or diced into separate portions, each having a respective diode. After fabrication, the diode 14 may be coupled to the cavity 30 through lower diode contact 88 thermosonically with an AuSn eutectic solder. After being coupled, the diode 14 may be etched or trimmed to a precise size by a saturation current.

As noted above, the dimensions of the cavity 30 are determined by the required value of the inductance L of the series inductor 34 of FIG. 5. For example, in the particular embodiment in which the cavity 30 has a semi-circular cross-sectional shape, the radius R2 from the center of the flat wall 58 to the curved wall 56 (minus the thickness of the metal layer on the curved wall 56), and the height H of the cavity 30 are chosen to ensure that the inductance L is at resonance with the RC element 92 at the desired oscillator signal frequency.

For the preferred embodiment in which the oscillator cavity 30 has a semi-circular cross-sectional shape, the inductance L of the series inductor element 34 can be approximated by the impedance Z of a radial line shorted at the outer periphery using the following formula: $L \approx Z \approx 60*H/R1)*\tan(k*(R2-R1))$. In this equation, H is the height of the cavity 30 and R1 represents the radial distance from the center of the non-metallized cavity wall 58 to the center of the diode 14. R2 represents the radial distance from the center of the non-metallized cavity wall 58 to the opposite curved/metallized cavity wall 56 minus the thickness of the metal layer on the curved wall 56. Once the specific inductance L is determined based on the desired oscillator signal frequency and the values of the RC element 92, the physical dimensions of the cavity (H, R1, and R2) can be determined by the approximated impedance formula above. For cavities with shapes other than a semi-circular cross-sectional shape, the equivalent series inductance L can be approximated by other known impedance formulas, which can be used to determine cavity shape and dimensions in a similar manner.

Modifications and alternative embodiments of the invention will be apparent to those skilled in the art in view of the foregoing description. This description is to be construed as illustrative only, and is for the purpose of teaching those skilled in the art the best mode of carrying out the invention. The details of the structure and method may be varied substantially without departing from the spirit of the invention, and the exclusive use of all modifications which come within the scope of the appended claims is reserved.

What is claimed is:

1. A millimeter-wave/microwave oscillator circuit, comprising:

a substrate;

a transmission line disposed in a first portion of said substrate for radiating oscillator signals at an oscillator signal frequency;

a resonator cavity disposed in a second portion of said substrate and coupled to said transmission line, the resonator cavity having an equivalent inductance;

a negative resistance diode coupled to said transmission line and disposed in said resonator cavity, the negative resistance diode having an equivalent capacitance and an equivalent resistance substantially resonant with said equivalent inductance of said resonator cavity; and an RF impedance transformer segment disposed in a third portion of said substrate and coupled to said cavity and said transmission line for impedance matching between said transmission line and said cavity.

2. The circuit of claim 1, wherein said resonator cavity has a semi-circular cross-sectional shape.

3. The circuit of claim 1, wherein said substrate comprises an upper substrate portion and a lower substrate portion, wherein a top portion of said transmission line, a top portion of said cavity, and said RF impedance transformer segment are disposed in said upper substrate portion, and wherein a bottom portion of said transmission line and a bottom portion of said cavity are disposed on said lower substrate portion, and wherein the negative resistance diode is disposed in said bottom portion of said cavity, and wherein both said upper substrate portion and said lower substrate portion are electrically coupled together.

4. The circuit of claim 3, wherein said cavity has a semi-circular cross-sectional shape.

5. The circuit of claim 4, wherein said cavity has a height H and is formed by a first planar wall and a second, arcuate wall disposed at a radius R2 from a center point of the first wall, wherein the equivalent inductance of the cavity is determined by:

$$L \approx 60*(H/R1)*\tan(k*(R2-R1)),$$

where L is the equivalent inductance, R1 is a distance from the center point of the first wall to the negative resistance diode and k is a wave number.

6. The circuit of claim 3, wherein said cavity is air-filled.

7. A method of fabricating a millimeter-wave/microwave oscillator circuit having a substrate, said method comprising the steps of:

etching a first plane in said substrate;

etching a second plane in said substrate;

depositing conductive material on the first and second planes to form a transmission line;

etching a resonator cavity in said substrate coupled to said transmission line;

depositing conductive material on surfaces defining the resonator cavity;

disposing a negative resistance diode in said resonator cavity; and electrically connecting the negative resistance diode to the transmission line.

8. The method of claim 7, wherein said step of etching the resonator cavity comprises the step of forming said resonator cavity into a semi-circular cross-sectional shape.

9. The method of claim 7, wherein said method further comprises the step of forming an RF impedance transformer segment in said substrate between said etched transmission line and said resonator cavity wherein the RF impedance transformer segment provides impedance matching between said transmission line and said resonator cavity.

10. A method of fabricating a millimeter-wave/microwave oscillator circuit, said method comprising the steps of:

providing upper and lower substrate portions;

forming a first portion of a transmission line in said lower substrate portion;

forming a first portion of a resonator cavity in said lower substrate portion;

forming a second portion of said resonator cavity in said upper substrate portion:

forming a second portion of said transmission line in said upper substrate portion;

forming an RF impedance transformer segment in said upper substrate portion, wherein said RF impedance transformer segment is coupled in series between said second portion of said transmission line and said second portion of said resonator cavity;

disposing a negative resistance diode in said first portion of said resonator cavity;

connecting said negative resistance diode to said first portion of said transmission line and to said first portion of said resonator cavity; and coupling said upper substrate portion to said lower substrate portion.

11. The method of claim 10, wherein said method further comprises the steps of etching said first portion of said resonator cavity and said second portion of said resonator cavity in the form of a semi-circular cross-sectional shape.

12. A negative resistance diode oscillator, comprising;

a transmission line;

a resonator cavity with a semi-circular cross-sectional shape with a height H and a radius $R2$, wherein said cavity has an equivalent inductance L;

an impedance matching segment coupled between said cavity and said transmission line for providing an impedance match between said cavity and said transmission line;

a negative resistance diode coupled to said cavity at a distance $R1$ from a planar wall of the cavity such that an equivalent capacitance C of said negative resistance diode is resonant with said inductance L at said oscillator frequency, wherein the inductance L is substantially equal to:

$$L \approx 60*(H/R1)*\tan(k*(R2-R1)),$$

with k being a wave number.

* * * * *